United States Patent [19]
Watatani et al.

[11] Patent Number: 5,798,742
[45] Date of Patent: Aug. 25, 1998

[54] ACTIVE MATRIX PANEL AND METHOD FOR FABRICATING THE SAME

[75] Inventors: Masahide Watatani, Tenri; Toshihiro Yamashita, Nara; Takayuki Shimada, Yamatokoriyama, all of Japan

[73] Assignee: Sharp Kabushiki Kaisha, Osaka, Japan

[21] Appl. No.: 358,012

[22] Filed: Dec. 16, 1994

[30] Foreign Application Priority Data

Dec. 20, 1993 [JP] Japan .................. 5-319902
Apr. 20, 1994 [JP] Japan .................. 6-081887

[51] Int. Cl.$^6$ .................................................. G09G 3/36
[52] U.S. Cl. ............................................ 345/98; 345/100
[58] Field of Search ................................ 345/92, 93, 94, 345/95, 96, 97, 98, 99, 100, 104, 206, 52; 359/54, 55, 56, 57

[56] References Cited

U.S. PATENT DOCUMENTS

| | | | |
|---|---|---|---|
| 4,931,787 | 6/1990 | Shannon | 340/784 |
| 5,151,806 | 9/1992 | Kawamoto et al. | |
| 5,159,477 | 10/1992 | Shimada et al. | 359/59 |
| 5,185,601 | 2/1993 | Takeda et al. | 340/784 |
| 5,250,931 | 10/1993 | Misawa et al. | 345/206 |
| 5,252,957 | 10/1993 | Itakura | 345/98 |
| 5,335,023 | 8/1994 | Edwards | 348/800 |
| 5,384,496 | 1/1995 | Tanaka | 327/94 |
| 5,412,397 | 5/1995 | Kanatani et al. | 345/99 |
| 5,506,598 | 4/1996 | Shimada et al. | 345/92 |
| 5,576,730 | 11/1996 | Shimada et al. | 345/98 |
| 5,576,857 | 11/1996 | Takemura | 359/59 |
| 5,583,535 | 12/1996 | Takarada et al. | 345/99 |

FOREIGN PATENT DOCUMENTS

| | | |
|---|---|---|
| 4107318 A1 | 3/1991 | Germany . |
| 62-178296 | 8/1987 | Japan . |
| 5-165438 | 7/1993 | Japan . |

OTHER PUBLICATIONS

Nakamura et al, "3.3-inch 1.9MPixel Integrated Driver Poly-Si TFT-LCD for HDTV Projector", IEEE International Solid-State Circuits Conference, p. 154.

*Primary Examiner*—Matthew Luu
*Attorney, Agent, or Firm*—Nixon & Vanderhye, P.C.

[57] ABSTRACT

An active matrix panel includes: a liquid crystal section having a plurality of pixels arranged in a matrix; a plurality of source lines for applying video signals to the plurality of pixels; a source driver for sequentially applying the video signals to the plurality of source lines; and a plurality of sample hold capacitances for holding the video signals applied to the source line, wherein each of the source lines is connected to a predetermined number of the sample hold capacitances in parallel.

28 Claims, 12 Drawing Sheets

5,798,742

ACTIVE MATRIX PANEL AND METHOD FOR FABRICATING THE SAME

BACKGROUND OF THE INVENTION

1. Field of the Invention

The present invention relates to an active matrix panel using an active element such as a thin film transistor (referred to as "TFT", hereinafter) or the like as a switching element and a method for fabricating the same, and more particularly to a liquid crystal display apparatus provided with such an active matrix panel.

2. Description of the Related Art

An equivalent circuit for an exemplary conventional active matrix panel is shown in FIG. 11. The conventional active matrix panel has a plurality of gate lines $X_1$ through $X_n$, and a plurality of source lines $Y_1$ through $Y_n$ arranged so as to perpendicularly cross these gate lines. A gate driver 4 is connected to the gate lines $X_1$ through $X_n$ so that a gate signal is applied from the gate driver 4 to each of the gate lines $X_1$ through $X_n$. The source lines $Y_1$ through $Y_n$ are connected to a source driver 1. The source driver 1 includes sampling gates $S_1$ through $S_n$, a shift register 2 and a video signal line 3. The shift register 2 sends a signal for sequentially tuning sampling gates $S_1$ through $S_n$ ON/OFF. A video signal has been transmitted to the video signal line 3. As a source signal, this video signal is sequentially supplied to the source lines $Y_1$ through $Y_n$ via the sampling gates $S_1$ through $S_n$ which are sequentially turned ON. In addition, sample hold capacitances 8 are disposed between the sampling gates $S_1$ through $S_n$, and the source lines $Y_1$ through $Y_n$. For all of the sample hold capacitances 8, one of the electrodes constituting each sample hold capacitance 8 is connected to a common wiring 9. The gate lines $X_1$ through $X_n$ and source lines $Y_1$ through $Y_n$ are formed on a substrate (not shown). The drivers 1 and 4, the sample hold capacitances 8 and the common wiring 9 are also formed on the substrate.

TFTs 5 as switching elements are formed in the vicinity of the respective intersections of the gate lines $X_1$ through $X_n$ and the source lines $Y_1$ through $Y_n$. Pixels 6 are connected to each of the TFTs 5 so that the source signal is written into the pixel 6 by the TFT 5. Furthermore, an additional capacitance 7 is provided for each of the pixels 6. One of the electrodes constituting the additional capacitance 7 is connected to the drain electrode of the TFT 5. The other electrode constituting the additional capacitance 7 is connected to an additional capacitance common electrode via an additional capacitance common wiring 10. In the case where an active matrix panel shown in FIG. 11 is attached to a counter substrate so as to constitute a liquid crystal display apparatus, this electrode is grounded together with a counter electrode on the counter substrate.

The operation of the conventional active matrix panel shown in FIG. 11, especially that of the sample hold capacitance 8, will be described hereinafter.

In FIG. 11, the shift register 2 within the source driver 1 sends a sampling signal to each of the sampling gates $S_1$ through $S_n$ so that the sampling signal sequentially scans the sampling gates. Thus, the sampling gates $S_1$ through $S_n$ are turned ON one by one in a time sharing manner. As described above, the video signal input from the outside has been transmitted into the video signal line 3. The sampling gates $S_1$ through $S_n$ are turned ON, whereby the video signal is sequentially sampled by each of the source lines $Y_1$ through $Y_n$. The sampled video signal is charged by each source line as an electric charge. Such a sampling of the video signal is performed for all the source lines $Y_1$ through $Y_n$ in a sequential order. When the sampling for all the source lines is finished, one gate line selected from among all the gate lines $X_1$ through $X_n$ is turned ON. Thus, as an electric charge, the video signals which have been sampled are supplied at a time to all the pixels 6 connected to the selected gate line. Thereafter, such a process is repeated for all the remaining gate lines $X_1$ through $X_n$ in a sequential order, whereby one picture is accomplished.

In the case where a display operation is performed in this way, the video signal sampled by each of the source lines $Y_1$ through $Y_n$ needs to be securely held at least until the sampling for all the source lines $Y_1$ through $Y_n$ is accomplished. For this purpose, the sample hold capacitance 8 is provided for each of the source lines $Y_1$ through $Y_n$.

Apart from the method using the shift register 2 in the source driver 1 as a circuit for generating a sampling signal selecting the source lines $Y_1$ through $Y_n$, a method of decoding data of little less than 10 bits is also known in the field. The method using a decoder is disclosed, for example, in 1994 IEEE International Solid-state Circuits Conference p. 154.

FIG. 12 is a circuit diagram showing an exemplary configuration of the shift register 2 for use in the source driver 1 shown in FIG. 11. This shift register 2 has a redundant structure as described below. The redundant structure is disclosed, for example in Japanese Laid-open Patent Publication No. 5-165438.

In FIG. 12, two shift registers 2a and 2b arranged in parallel are actually used as the shift register 2. The output terminals of respective bits of the shift registers 2a and 2b are connected to a NAND gate 11. Via an inverter 12 constituting a buffer, the output terminal of the NAND gate 11 is connected to one of the sampling gates $S_1$ through $S_n$, so that an output of the NAND gate 11 is input to the sampling gate as a control signal. Each of the two shift registers is divided into a plurality of blocks each including a predetermined number of stages. The final output from each of the blocks is input to an NOR gate 13, and the output of the NOR gate 13 is input to the next block.

In a case where a defect arises in the circuit shown in FIG. 12, the defect makes the output from one shift register abnormal. As a result, at least one sampling signal output via at least one inverter 12 connected to the defective shift register, may become abnormal, too. In this case, the input terminals of the NAND gates 11 and the input terminals of the NOR gates 13, which are connected to the defective shift register, are cut by radiation of a laser beam. Thus, the defect can be repaired by separating the shift register whose output is abnormal from the other shift register. According to the redundant structure as shown in FIG. 12, even if a plurality of defects arise in the shift register 2, the defects can be repaired by such a technique unless the defects arise at both of the corresponding blocks of the two shift registers. For this reason, the yield of the source driver is improved.

In the conventional active matrix panel shown in FIG. 11, however, electrostatic destruction may occur in the sample hold capacitance 8 due to static electricity or the like caused in the step after the active matrix panel is accomplished (e.g., in a rubbing treatment of an alignment film). As a result, a leakage current arises in the sample hold capacitance 8. In the source line connected to the defective sample hold capacitance 8 in which the leakage current arises, it becomes impossible to hold an electric charge. The pixel 6 connected to such a source line displays an image with a contrast greatly different from that obtained by a normal pixel 6, which results in the deterioration of display qualities of the liquid crystal display apparatus.

Also, when the circuit including the shift registers each of which is divided in blocks as shown in FIG. 12 is used as the source driver 1, a sampling timing in the case where the defect is repaired by a laser beam radiation does not coincide with that in the case where no defect arises and thus no repair is made. The reasons for such a timing deviation will be described hereinafter.

FIGS. 13A and 13B respectively show specific configurations of the NAND gate 11 and the NOR gate 13 shown in FIG. 12. With reference to FIG. 13B, the operation of the NOR gate 13 will be described. As shown in FIG. 13B, the NOR gate 13 includes two PMOS transistors 13a and 13b and two NMOS transistors 13c and 13d. In the case where both of the two shift registers are normally working, the same signal is input to two input terminals in1 and in2. For example, when a signal having the level of a logic state of 1 (hereinafter, referred to as "Vdd") is input to the two input terminals in1 and in2, the NMOS transistors 13c and 13d are both rendered conductive, and the output out of the NOR gate 13 is in a logic state of an output of 0 (hereinafter, referred to as "GND"). However, in the case where the defect occurs in either of the two registers is repaired, one of the two input terminals in1 and in2 of the NOR gate 13 is fixed to GND. In such a condition, the NMOS transistor which becomes conductive when the output out of the NOR gate 13 changes from Vdd to GND is limited to one transistor. As a result, the driving ability of the NOR gate 13 is reduced to a half of the normal one. This changes a delay between the clock signal input to the source driver and the sampling signal output from the NOR gate 13. Consequently, the sampling timing of the sampling gate corresponding to the block including the defect deviates. In the case where the sampling timing deviates greatly, the display qualities may deteriorate to an extent that, for example, a bump is visualized as slant lines. The NAND gate 11 corresponding to each of the sampling gates operates in a similar manner, which results in the sampling timing deviation between the repaired shift register and the normal shift register without repair.

Such a deviation of sampling timing occurs not only in the case of using the shift register with its defect repaired but also in the case of using a normal decoder. FIG. 14A schematically shows a sampling signal generating section of the source driver using a decoder in place of a shift register. FIG. 14B is a waveform view showing the signal obtained in each portion of the circuit shown in FIG. 14A. For simplicity, the case of using a decoder of 2 bits is described herein. Though a decoder of 9 bits or more is used in an actual display apparatus in terms of practicality, the description may be easily extended so as to be applicable to such a scale.

As shown in FIG. 14A, in the source driver using the decoder, selection signals $2^0$ through $2^1$ are input to the NOR gates 21a through 21d, respectively. In accordance with the combination of the input signals, one sampling gate is selected. The NOR gates 21a through 21d are configured as shown in FIG. 13B. The outputs from the NOR gates 21a through 21d are input to the control terminals of the sampling gates $S_1$ through $S_n$ as selected pulses. The sampling timing at each of the sampling gates $S_1$ through $S_n$ is determined by the fall time of this selected pulse, i.e., the time when the waveform of each of outputs A through D falls. However, also in the thus configured decoder, the sampling timing deviates similarly to the case using the shift register with its defect repaired.

For example, in the case where the selection signals $2^0$ through $2^1$ having the waveforms as shown in FIG. 14B are applied to the circuit shown in FIG. 14A, the two inputs to the NOR gate 21a both change from GND to Vdd at the fall time of the output A. As a result, the two NMOS transistors are both rendered conductive. Similarly, the two NMOS transistors are rendered conductive in the NOR gate 21c also at the fall time of the waveform of the output C. However, at the fall time of the waveform of the output B, one of the inputs to the NOR gate 21a is retained as GND, while the other input changes from GND to Vdd. Hence, only one NMOS transistor is rendered conductive at the fall time of the waveform of the output B. Similarly, at the fall time of the waveform of the output D, only one of the two NMOS transistors is rendered conductive. Thus, driving abilities of the NOR gates 21a and 21c are different from those of the NOR gates 21b and 21d. Consequently, the degree of the delay is different in one NOR gate from another. As a result, in the source driver using not a shift register but a decoder, even if it has no defect, the sampling timing deviates between the sampling gates and results in the deterioration of display qualities.

These deteriorations of display qualities occur in the case where the above-mentioned timing deviation is too large to be ignored with respect to the sampling intervals between the sampling gates. Especially, in a high definition liquid crystal having the sampling interval of 100 nsec or less, display qualities are deteriorated even by a small timing deviation of several tens nsec.

Furthermore, in the case where polycrystalline silicon TFTs are used for respective elements constituting the driver, it becomes possible to monolithically form the driver on the substrate of the active matrix panel. However, in this case, the delay is larger than that in the driver using single crystal silicon TFTs. This is because the career of mobility of the polycrystalline silicon layer is less than a small fraction of that of the single crystal silicon layer. For this reason, in the case where the driver using polycrystalline silicon TFTs is monolithically formed on the substrate of the active matrix panel, the sampling deviation is more significant than in the case of an external driver using single crystal silicon TFTs.

SUMMARY OF THE INVENTION

The active matrix panel of the present invention includes: a liquid crystal section having a plurality of pixels arranged in a matrix; a plurality of source lines for applying video signals to the plurality of pixels, a source driver for sequentially applying the video signals to the plurality of source lines; and a plurality of sample hold capacitances for holding the video signals applied to the source line, wherein each of the source lines is connected to a predetermined number of the sample hold capacitances in parallel.

In one embodiment of the invention, a capacitance value of each of the sample hold capacitances is set so that an electric charge corresponding to one of the video signals is held by the sample hold capacitances, wherein the number of the sample hold capacitances is less than the predetermined number by one.

According to another aspect of the present invention, an active matrix panel includes: a liquid crystal section having a plurality of pixels arranged in a matrix; a plurality of source lines for applying video signals to the plurality of pixels; a source driver for sequentially applying the video signals to the plurality of source lines; and a sample hold capacitance for holding the video signals applied to the source line, wherein the sample hold capacitance has a pair of electrodes and at least one of the pair of electrodes is in a shape of a comb having a predetermined number of branch parts.

In another embodiment of the invention, a capacitance value of the sample hold capacitance is set so that an electric charge corresponding to one of the video signals is held by the branch parts, wherein the number of the branch parts is less than the predetermined number by one.

In another embodiment of the invention, each of the predetermined number of branch parts has a tip portion and a root portion, the root portion is connected to that of an adjacent branch part, and a width of the root portion is smaller than that of the tip portion.

In another embodiment of the invention, the source driver includes: a plurality of sampling switching elements for, when being rendered conductive, applying the video signals to the plurality of source lines; sampling signal applying means for sequentially applying a plurality of sampling signals to the plurality of sampling switching elements to render the plurality of sampling switching elements conductive; and adjustment means for adjusting a timing at which each of the plurality of sampling switching elements is rendered conductive.

In another embodiment of the invention, the sampling signal applying means includes a plurality of logic elements generating the plurality of sampling signals, respectively, and the adjustment means is a plurality of load carrying capacitances, each of the plurality of load carrying capacitances being arranged in parallel with an output terminal of a corresponding logic element among the plurality of load carrying capacitances and being cut from the corresponding logic element when one of input terminals of the corresponding logic element is cut.

In another embodiment of the invention, the sampling signal applying means include a plurality of logic elements for selectively receiving a plurality of selection signals and for generating the plurality of sampling signals in accordance with the received selection signals; and wherein driving abilities of the plurality of logic elements are different depending on combination of the received selection signals, and the adjusting means adjusts the driving abilities of the plurality of logic elements to be substantially equal.

In another embodiment of the invention, the plurality of logic elements have a plurality of transistors rendered conductive by the received selection signals, and the adjustment means is a plurality of load carrying capacitances, the plurality of load carrying capacitances being connected in parallel with an output terminal of a corresponding logic element in accordance with the number of transistors rendered conductive at a fall time of each of the sampling signals in the corresponding logic element.

In another embodiment of the invention, the plurality of logic elements include a plurality of transistors rendered conductive by the received selection signals, and the adjustment means includes a plurality of load carrying capacitances provided at respective output terminals of the plurality of logic elements and a changeover switching element for selectively and electrically connecting the plurality of logic elements to a corresponding load carrying capacitance in accordance with a control signal.

In another embodiment of the invention, the source driver includes: a plurality of sampling switching elements for, when being rendered conductive, applying the video signals to the plurality of source lines; and sampling signal applying means for sequentially applying a plurality of sampling signals which render the sampling switching elements conductive to the sampling switching elements, wherein the sampling signal applying means includes a plurality of logic elements generating the plurality of sampling signals, respectively, each of the logic elements being provided with a plurality of transistors, and channel widths of the plurality of transistors are set in accordance with the number of transistors rendered conductive at a fall time of a corresponding sampling signal.

In another embodiment of the invention, the source driver includes: a plurality of sampling switching elements for applying the video signals to the plurality of source lines when being rendered conductive; and sampling signal applying means for sequentially applying a plurality of sampling signals which render the sampling switching elements conductive to the sampling switching elements, wherein the sampling signal applying means includes a plurality of logic elements each generating the plurality of sampling signals, respectively, each of the logic elements includes a plurality of transistors, and channel lengths of the transistors are set in accordance with the number of transistors rendered conductive at a fall time of a corresponding sampling signal.

In another embodiment of the invention, the active matrix panel further includes a substrate on which the liquid crystal section and the plurality of source lines are formed, wherein the source driver is formed on the substrate.

According to another aspect of the present invention, an active matrix panel includes: a liquid crystal section having a plurality of pixels arranged in a matrix; a plurality of source lines for applying video signals to the plurality of pixels; and a source driver for sequentially applying the video signals to the plurality of source lines, the source driver including: a plurality of sampling switching elements for, when being rendered conductive, applying the video signal to the plurality of source lines; and sampling signal applying means for sequentially applying a plurality of sampling signals which render the sampling switching elements conductive to the sampling switching elements, wherein the sampling signal applying means includes a plurality of logic elements for generating a plurality of sampling signals and adjustment means for adjusting a deviation of timing at which the sampling switching elements are rendered conductive, the deviation resulting from a difference in driving ability among the plurality of logic elements.

In another embodiment of the invention, the adjustment means is a plurality of load carrying capacitances, each of which is arranged in parallel with an output terminal of a corresponding logic element among the plurality of logic elements and is cut from the corresponding logic element when one of input terminal of the corresponding logic element is cut.

In another embodiment of the invention, the plurality of logic elements selectively receive a plurality of selection signals and generate the plurality of sampling signals in accordance with the received selection signals, driving abilities of the logic elements are different depending on combination of the received selection signals, and the adjustment means adjusts the driving abilities of the logic elements to be substantially equal.

In another embodiment of the invention, the plurality of logic elements include a plurality of transistors rendered conductive by the received selection signals, and the adjustment means is a plurality of load carrying capacitances, the load carrying capacitances in the corresponding logic element being connected in parallel with an output terminal of the corresponding logic element in accordance with the number of transistors rendered conductive at a fall time of each of the sampling signals.

In another embodiment of the invention, the logic elements have a plurality of transistors rendered conductive by the received selection signals, and the adjustment means has a plurality of load carrying capacitances provided at respective output terminals of the plurality of logic elements and a changeover switching element for selectively and electrically connecting the logic elements to a corresponding load carrying capacitance in accordance with a control signal.

In another embodiment of the invention, each of the plurality of logic elements has a plurality of transistors, and channel widths of the transistors are set in accordance with the number of transistors rendered conductive at a fall time of a corresponding sampling signal.

In another embodiment of the invention, each of the plurality of logic elements has a plurality of transistors, and channel lengths of the transistors are set in accordance with the number of transistors rendered conductive at a fall time of a corresponding sampling signal.

In another embodiment of the invention, the active matrix panel further includes a substrate on which the liquid crystal section and the plurality of source lines are formed, wherein the source driver is formed on the substrate.

According to another aspect of the present invention, there is provided a method for fabricating an active matrix panel, the active matrix panel including: a liquid crystal section having a plurality of pixels arranged in a matrix; a plurality of source lines for applying video signals to the plurality of pixels; a source driver for sequentially applying the video signals to the plurality of source lines; and a plurality of sample hold capacitances for holding the video signals applied to the source line, a predetermined number of the plurality of sample hold capacitances being connected in parallel to each of the source lines, the method including a step of electrically cutting one of the plurality of sample hold capacitances, which includes a defect, from a corresponding source line.

According to another aspect of the present invention, there is provided a method for fabricating an active matrix panel, the active matrix panel including: a liquid crystal section having a plurality of pixels arranged in a matrix form; a plurality of source lines for applying video signals to the plurality of pixels; a source driver for sequentially applying the video signals to the plurality of source lines; and a sample hold capacitance for holding the video signal applied to the source line, the sample hold capacitance having a pair of electrodes at least one of which is in a shape of a comb having a predetermined number of branch parts, the method including a step of electrically cutting one of the plurality of branch parts, which includes a defect, from a corresponding source line.

In another embodiment of the invention, each of the predetermined number of branch parts has a tip portion and a root portion, the root portion being connected to that of an adjacent branch part, and a width of the root portion is smaller than that of the tip portion, and wherein the cutting step is performed by radiating the root portion with a laser beam.

According to another aspect of the present invention, there is provided a method for fabricating an active matrix panel, the active matrix panel including: a liquid crystal section having a plurality of pixels arranged in a matrix; a plurality of source lines for applying video signals to the plurality of pixels; and a source driver for sequentially applying the video signals to the plurality of source lines, the source driver including: a plurality of sampling switching elements for applying the video signal to the plurality of source lines when being rendered conductive; and sampling signal applying means for sequentially applying a plurality of sampling signals which render the plurality of sampling switching elements conductive to the plurality of sampling switching elements, the sampling signal applying means having a plurality of logic elements each generating the plurality of sampling signals, and a plurality of adjustment elements, respectively connected to output terminals of the plurality of logic elements, for adjusting a deviation of timing at which the plurality of sampling switching elements are rendered conductive, the deviation resulting from a difference in driving ability among the plurality of logic elements, wherein the method includes a step of, at the time of repairing a defect occurring in the sampling signal applying means, electrically cutting an adjustment element connected to an output terminal of the logic element generating an abnormal sampling signal due to the defect.

Thus, the invention described herein makes possible the advantages of: (1) providing an active matrix panel capable of displaying an image substantially free from abnormality in its contrast, if electrostatic destruction occurs in a sample hold capacitance; (2) providing an active matrix panel capable of preventing the deviation of the sampling timing after a defect of a shift register is repaired; (3) providing an active matrix panel using a decoder capable of preventing the deviation of the sampling timing; and (4) providing a display apparatus having such an active matrix panel and a method for fabricating the same.

These and other advantages of the present invention will become apparent to those skilled in the art upon reading and understanding the following detailed description with reference to the accompanying figures.

DESCRIPTION OF THE PREFERRED EMBODIMENTS

The embodiments of the present invention will be described with reference to the accompanying drawings.

Figure 1:
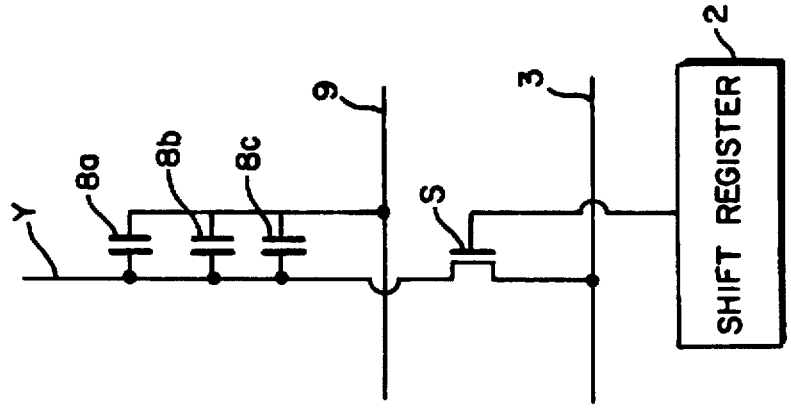
FIG. 1 is a diagram showing the vicinity of a sample hold capacitance in one example of an active matrix panel of the present invention.
Figure 11:
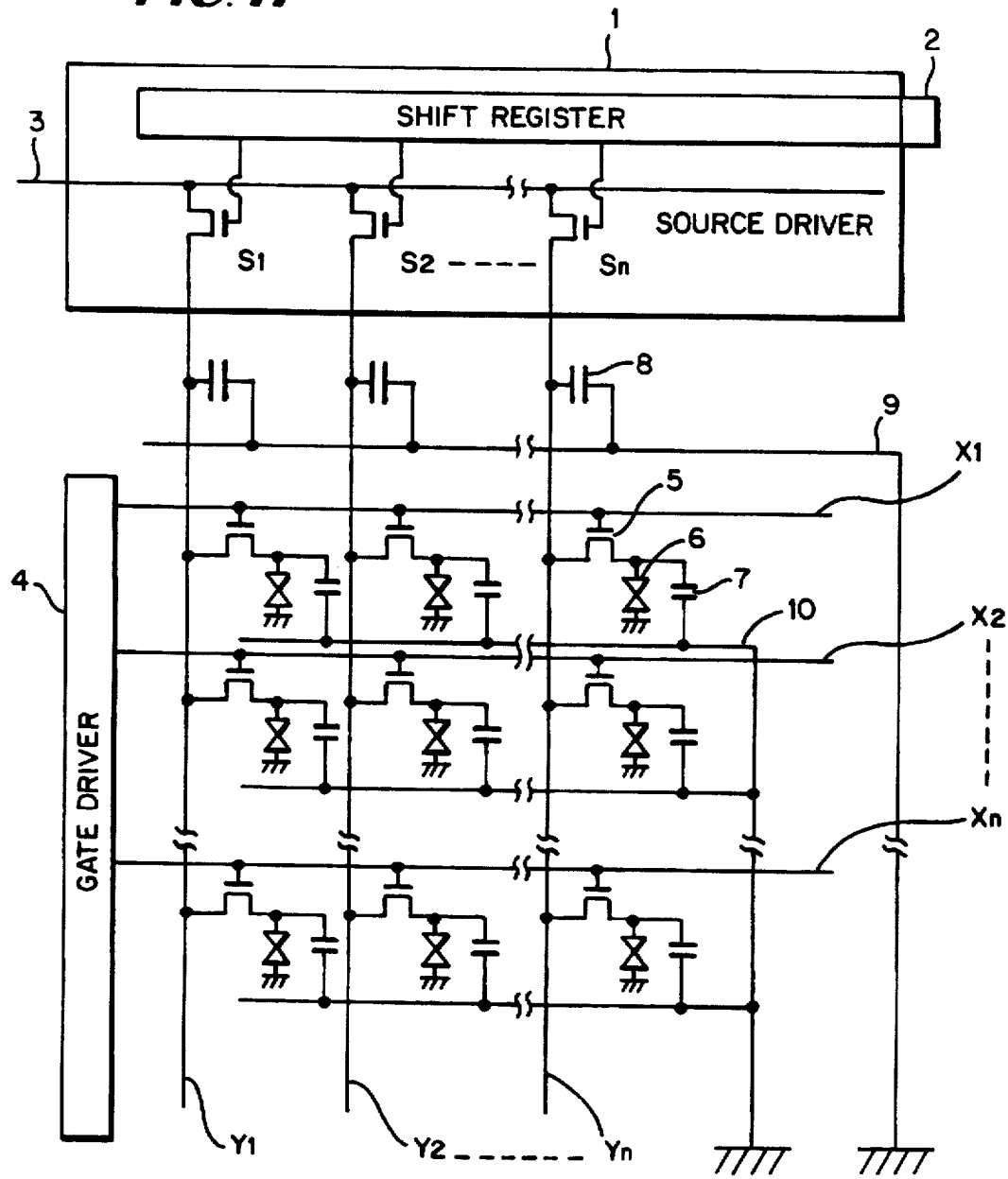
FIG. 11 is a diagram showing an equivalent circuit for a conventional active matrix panel.
Figure 12:
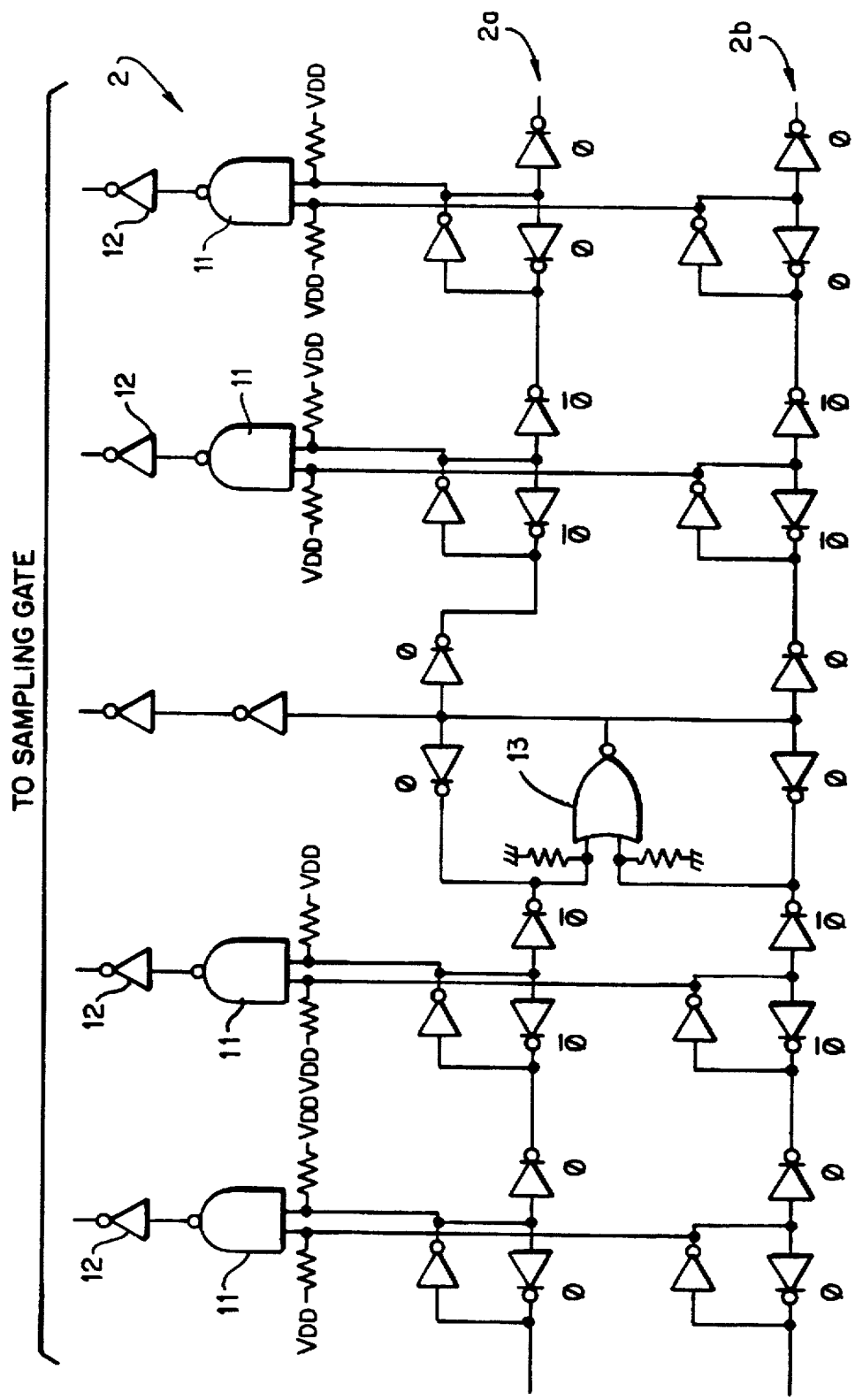
FIG. 12 is a circuit diagram showing one exemplary configuration of a shift register for use in the source driver shown in FIG. 11.
Figure 13A:
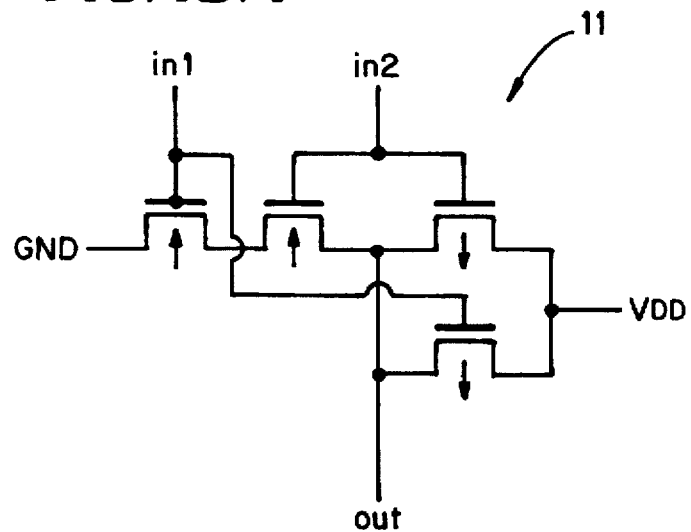
FIG. 13A is a circuit diagram showing a specific configuration for the NAND gate shown in FIG. 12.
Figure 13B:
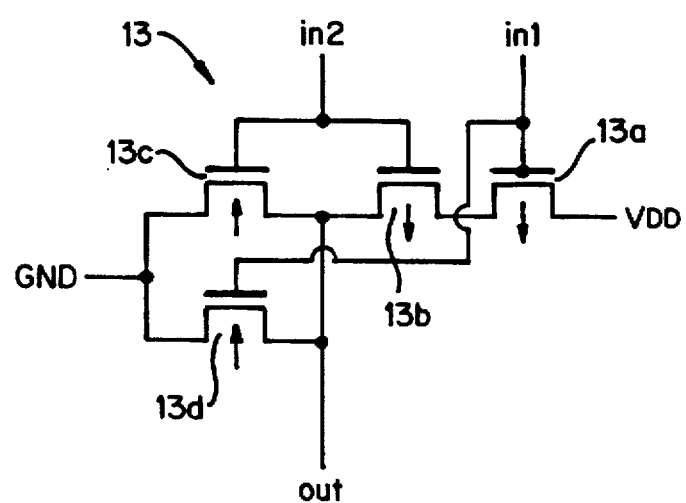
FIG. 13B is a circuit diagram showing a specific configuration for the NOR gate shown in FIG. 12.
Figure 14A:
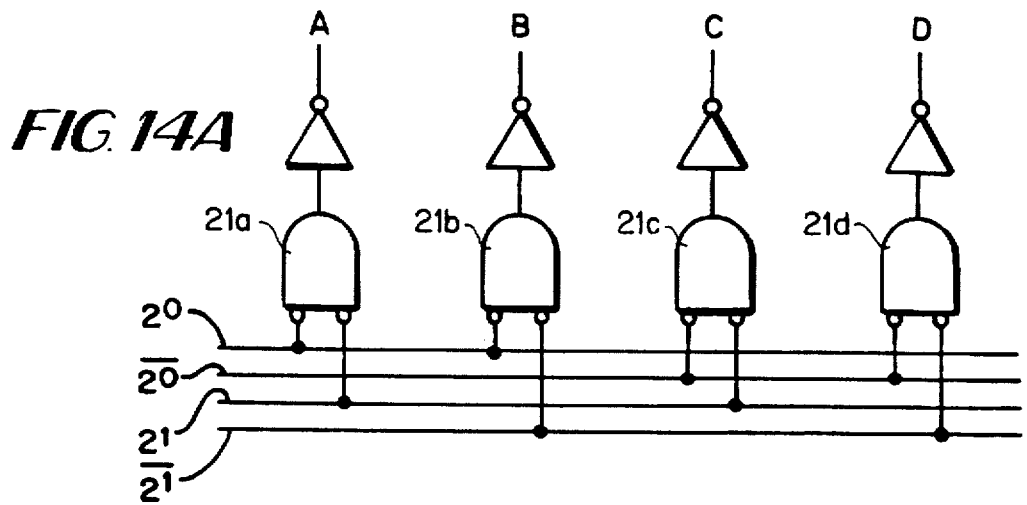
FIG. 14A is a circuit diagram showing a sampling generating circuit for a conventional source driver using a decoder.
Figure 14B:
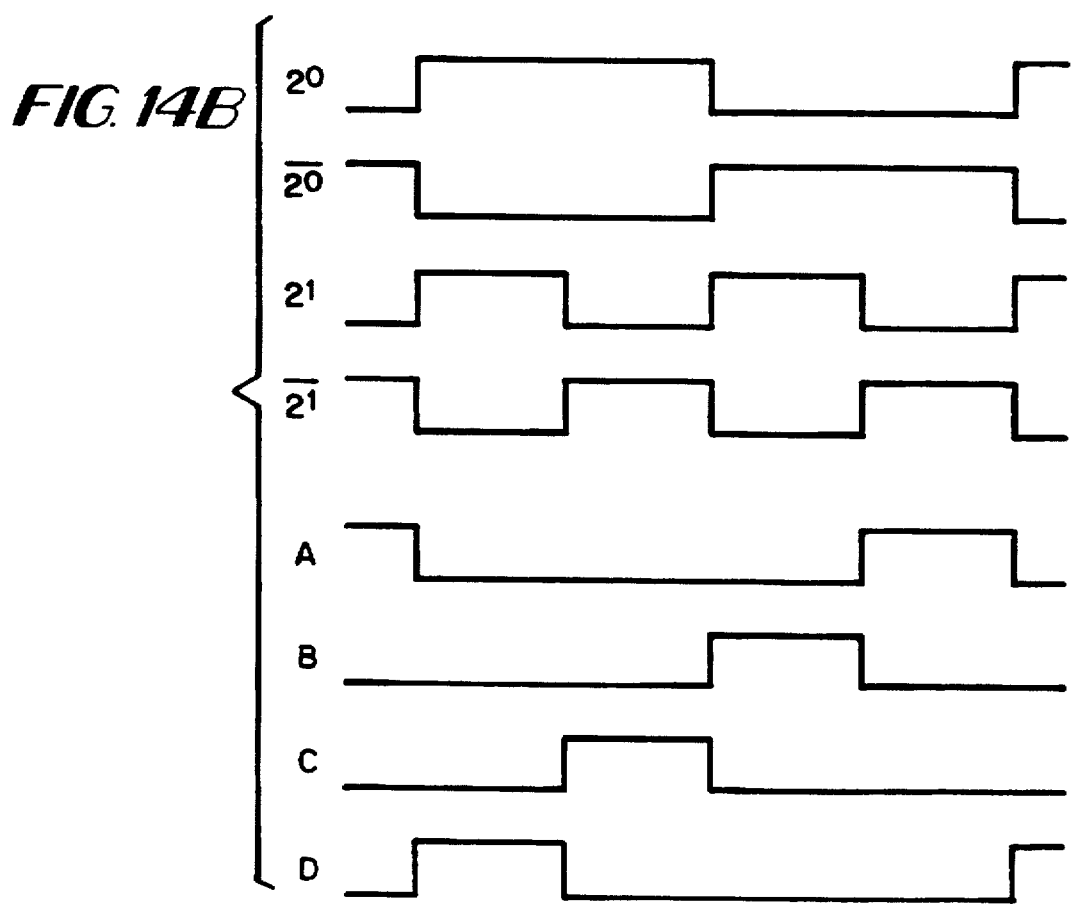
FIG. 14B is a waveform view showing the signal obtained at several points in the sampling signal generating circuit shown in FIG. 14A.

FIG. 1 is a diagram showing the vicinity of a sample hold capacitance in one embodiment of an active matrix panel of the present invention. The same components as those in the active matrix panel shown in FIG. 11 are denoted by the same reference numerals. The active matrix panel of the present embodiment includes a plurality of gate lines $X_1$ through $X_n$ formed on a substrate (not shown) and a plurality of source lines $Y_1$ through $Y_n$ arranged so as to perpendicularly cross these gate lines. A source line Y in FIG. 1 represents one of the source lines $Y_1$ through $Y_n$. The sampling gate S represents one of the sampling gates $S_1$ through $S_n$ which is connected to the source line Y. Unlike the conventional matrix panel shown in FIG. 11, three sample hold capacitances 8a, 8b and 8c are connected to a common wiring 9. All of the sample hold capacitances 8a, 8b and 8c and the common wiring 9 are provided on the substrate on which the gate lines $X_1$ through $X_n$ and the source lines $Y_1$ through $Y_n$ are formed.

The operation of the active matrix panel shown in FIG. 1 is the same as that of the conventional active matrix panel shown in FIG. 11, excepting that the video signal, sampled by each of the source lines $Y_1$ through $Y_n$, is charged and held by three sample hold capacitances 8a, 8b and 8c in place of one sample hold capacitance 8.

Hereinafter, a method for repairing an electrostatic destruction occurring in a part of the sample hold capacitance will be described. In the active matrix panel of this embodiment, three sample hold capacitances 8a, 8b and 8c are provided for one source line Y. Now, it is assumed that electrostatic destruction has occurred at the sample hold capacitance 8a. In this case, since a leakage current arises in the sample hold capacitance 8a, in order to stop the leakage current, the wiring of the sample hold capacitance 8a is cut either at the part connected to the source line Y or at the grounded part connected to the common wiring 9. The cutting is performed by conventional techniques, such as an irradiation of a laser beam. Since the remaining two sample hold capacitances 8b and 8c normally work, even if one sample hold capacitance 8a is cut, the electric charge necessary for the sampled video signal can be held by predetermining the capacitance values of the sample hold capacitances 8b and 8c so as to sufficiently hold the video signal without the sample hold capacitance 8a. Thus, the pixels connected to the source line Y can display an image without degradation of contrast noticeable to an observer, in comparison with the pixels connected to the source lines whose three sample hold capacitances 8a, 8b and 8c are all normally working.

In the present embodiment, three sample hold capacitances are provided for each single source line, and the capacitance value of each of these sample hold capacitances is set at a value capable of sufficiently holding an electric charge necessary for a video signal by only two of the capacitances. For example, in the present embodiment, the capacitance value of each of the three sample hold capacitances is set at 2 pF. The number of the sample hold capacitances provided for one source line is not limited to three. As far as a plurality of sample hold capacitances are provided for one source line, and the capacitance value of each of the sample hold capacitances is set so that an electric charge corresponding to a video signal can be held by the remaining sample hold capacitances if one of the sample hold capacitances is cut, the same effect as obtained in the present embodiment is assured.

Figure 2:
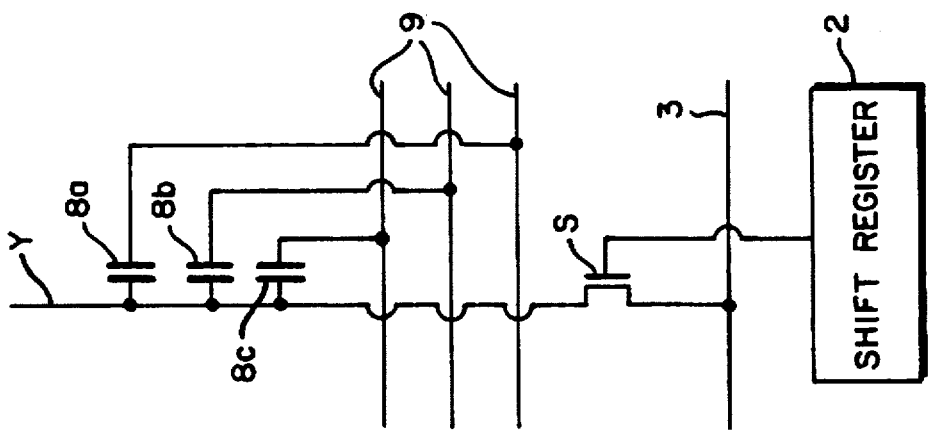
FIG. 2 is a diagram showing a modified example of an active matrix panel of the present invention.

Alternatively, the wiring 9 may be provided for each of the above-mentioned three sample hold capacitances 8a, 8b and 8c, instead of connecting three sample hold capacitances to one common wiring 9, as shown in FIG. 2. In such a configuration, the sample hold capacitance in which the leakage current has arisen can be easily identified by inspecting each wiring 9 whether it is conductive or not.

Figure 3:
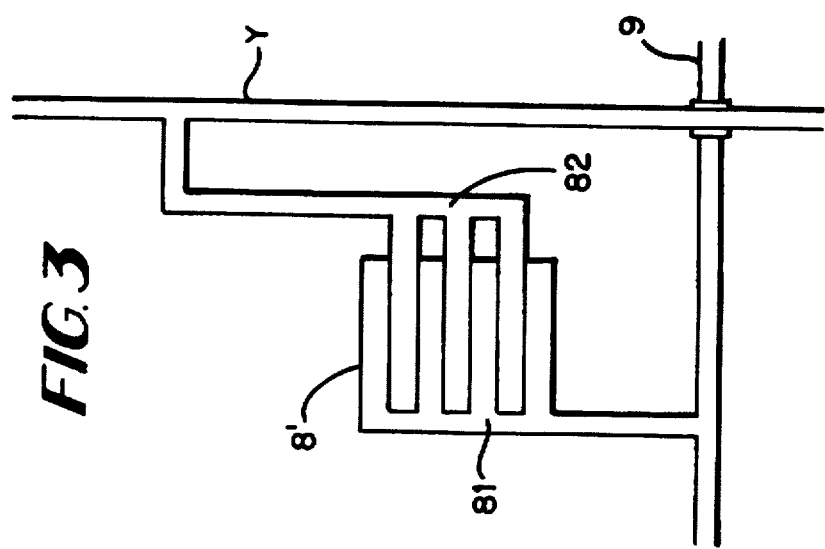
FIG. 3 is a diagram showing the vicinity of a sample hold capacitance in another example of an active matrix panel of the present invention.

Next, an active matrix panel according to another embodiment will be described. FIG. 3 shows the vicinity of a sample hold capacitance 8' of the present embodiment. The active matrix panel of the present embodiment has the same configuration as that of the above-mentioned embodiment, excepting that the three sample hold capacitances 8a, 8b and 8c are replaced with the sample hold capacitance 8'. Accordingly, the structural components other than the sample hold capacitance 8' will not be described here.

Figure 4:
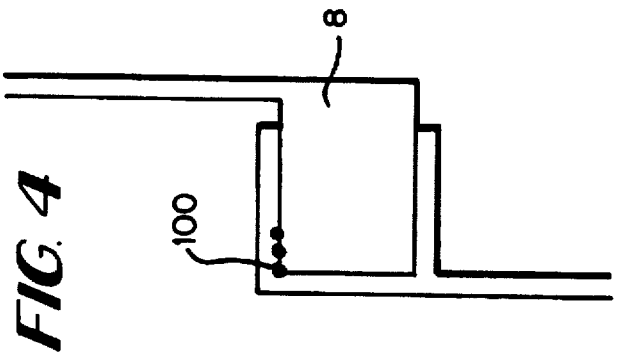
FIG. 4 is a diagram showing an electrostatic destruction in the sample hold capacitance.

In the present embodiment, as shown in FIG. 3, one electrode 82 of a pair of electrodes 81 and 82 (hereinafter, referred to as "capacitance electrodes") constituting the sample hold capacitance 8' is formed in the shape of a comb having a plurality of branch parts. The electrode 82 in such a comb shape can be divided into a plurality of electrode strips by being cut at its root portions of the branch parts. The capacitance electrode of the present embodiment is configured to be dividable into a plurality of electrode strips, for the following reasons. In most cases, the leakage current arising in the sample hold capacitance results from an electrostatic destruction 100 occurring at a part between the capacitance electrodes as shown in FIG. 4. Hence, the leakage current can be stopped by removing only the part of one of the capacitance electrodes in which the electrostatic destruction has occurred. Accordingly, in the present embodiment, in order to realize removal of only the part in which the electrostatic destruction 100 has occurred, a comb-shaped electrode is used as the electrode 82 which is one of the capacitance electrodes 81 and 82.

The value of the capacitance formed of the comb-shaped capacitance electrode 82 and the electrode 81 is set so as to allow the capacitance value to sufficiently hold the sample video signal even if one of the branch parts is cut or removed. For example, in the present embodiment, the comb-shaped capacitance electrode 82 is formed in the shape having three branch parts. The capacitance value in the case where no branch part is cut or removed is set at 6 pF, while the capacitance value in the case where one of the branch parts is cut or removed is set at 4 pF. Accordingly, the pixel 6 connected to the sample hold capacitance 8' one of whose branch parts is cut or removed can display an image with a contrast not so degraded as to be noticeable to an observer, in comparison with the pixel 6 connected to the normally working sample hold capacitance 8'. Thus, the active matrix panel of the present embodiment can display a satisfactory image even if the leakage current has arisen in the sample hold capacitance.

In the present embodiment, only one of the capacitance electrodes 81 and 82 is formed in a comb-shape. However, the same effects as those obtained by the present embodiment are assured also in the case where the capacitance electrodes 81 and 82 are both comb-shaped.

In the foregoing two embodiments, the sample hold capacitance or a part thereof in which the leakage current has arisen is cut or removed by means of techniques such as irradiation of a laser beam. Furthermore, in the case of cutting by the irradiation of a laser beam, the portion to be cut or removed may be previously formed to be thin for facilitating the cutting. In the latter embodiment, the root portion of each branch part of one capacitance electrode 82 may be formed so as not to overlap with the other capacitance electrode 81, which allows the cutting to be more easily performed.

In the foregoing two embodiments, in the case of electrically detecting the defect of the sample hold capacitance, the sample hold capacitance in which the leakage current has arisen or the branch part of the capacitance electrode including the part in which the leakage current has arisen is cut or removed after the active matrix panel has been completed. Meanwhile, in the case of optically detecting the defect of the sample hold capacitance, it is performed in a fabrication step where liquid crystal has been injected between the active matrix panel and the counter substrate, and thus the liquid crystal display has been completed.

As described hereinbefore, according to the active matrix panel of the present invention, a plurality of sample hold capacitances are provided for one source line, or at least one of the electrodes constituting the sample hold capacitance is formed into a comb-shape having a plurality of branch parts. As a result, in the case where an electrostatic destruction occurs in any of the plurality of sample hold capacitances or in any of the plurality of branch parts, only the sample hold capacitance or the branch part in which the electrostatic destruction has occurred can be cut or removed by the radiation of a laser beam or the like. Thus, even in the case where the electrostatic destruction has occurred in the sample hold capacitance, an active matrix panel assuring an image with a contrast not substantially affected thereby can be realized.

Next, an active matrix panel according to still another embodiment of the present invention will be described.

Figure 5:
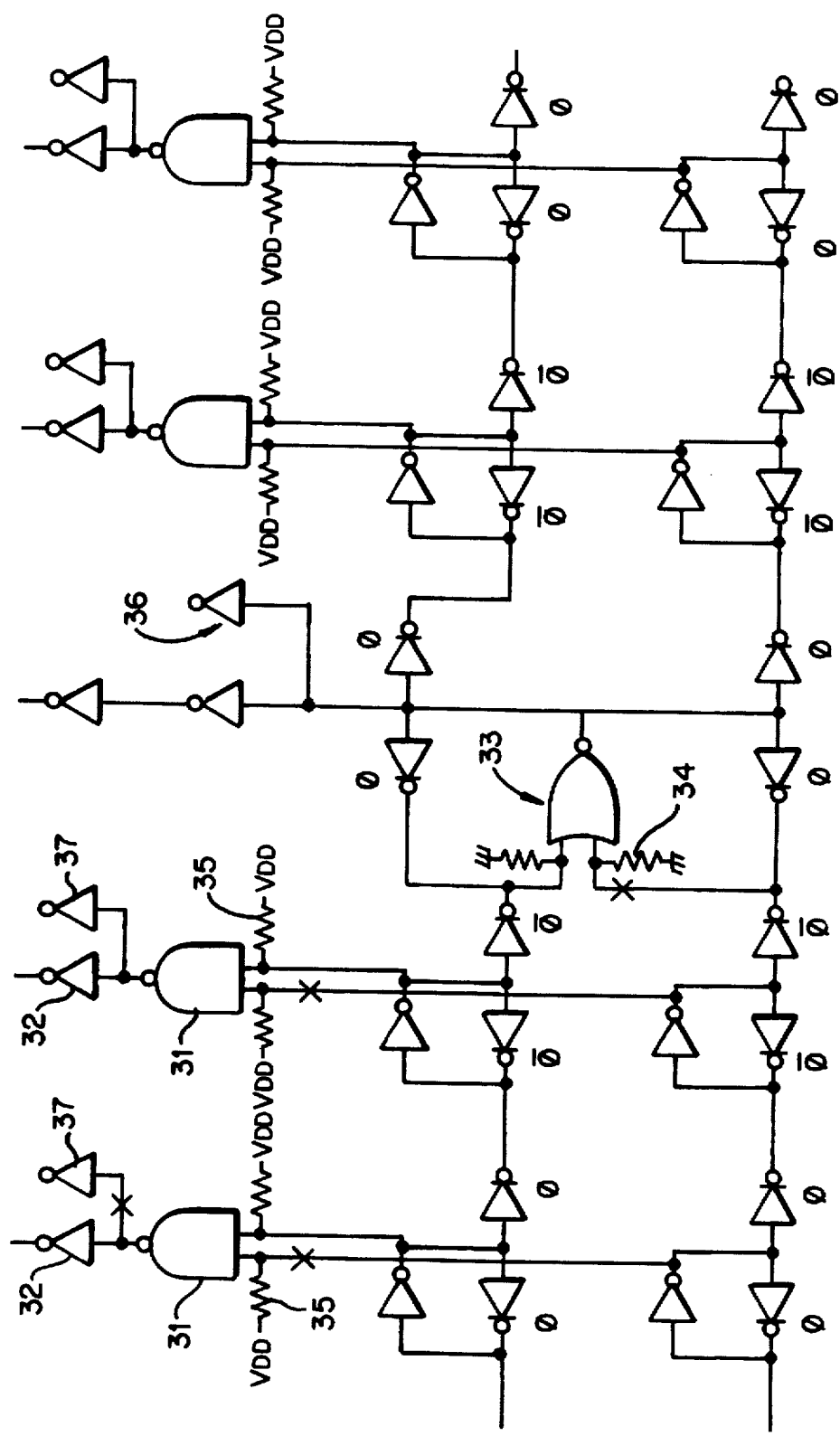
FIG. 5 is a circuit diagram showing a configuration for a shift register for use in a source driver of one example of an active matrix panel of the present invention.

FIG. 5 is a circuit diagram showing one exemplary shift register for use in the source driver of the active matrix panel according to still another embodiment of the present invention. In the present embodiment, a shift register having a redundant structure as described later is used as a sampling signal generating section. Apart from the source driver, the active matrix panel of the present embodiment has the same configuration as that of the conventional one. So, the description of the structural components other than the source driver will be omitted here.

As shown in FIG. 5, in the present embodiment, two shift registers arranged in parallel are used. The output of each bit of the shift register is input to a NAND gate 31 serving as a logic gate. The outputs of the corresponding bits of the two shift registers are input to the same NAND gate 31. As a sampling signal, the output of the NAND gate 31 is input to the corresponding sampling gate via an inverter 32 constituting a buffer. The sampling signal is a control signal controlling the sampling gate to be conducive or nonconductive. By this sampling signal, one of source lines $Y_1$ through $Y_n$ is sequentially selected for performing the sampling. Moreover, each of the two shift registers is divided into a plurality of blocks each including a predetermined number of stages. The outputs from the corresponding blocks to the two shift registers are both input to the same NOR gate 33. The output of the NOR gate 33 is input to the next block for each of the two shift registers.

In a case where a defect arises in one of the shift registers in the thus configured circuit, the sampling signal outputs via the inverters 32 connected to at least one bit of the block including the defect become abnormal. In this case, among the two inputs from the shift registers to the NAND gate 31 connected to the inverter 32 of which output has become abnormal, the input from the defective shift register is cut. At the same time, the input from the block in which the defect occurs to the NOR gate 33 is cut, too. The cutting is performed by a conventional technique such as irradiation of a laser beam. For example, assuming that the defect arises in one block of the lower shift register shown in FIG. 5. In this case, portions of the circuit marked with x in FIG. 5 are cut. Full-up resistances 35 are connected to the inputs from the two shift registers to the NAND gates 31, respectively. Pull-down resistances 34 are connected to the inputs to the NOR gate 33, respectively. Accordingly, the cut input to the NAND gate 31 is fixed to Vdd, while the cut input to the NOR gate 33 is fixed to GND. As a result, the sampling signal is determined by the other normally working shift register. This makes the source driver itself normally operate as a whole. In this way, even in the case where the defect arises in the sampling signal generating section, the defect can be repaired unless the defects arise at both of the corresponding blocks of the two shift registers. For this reason, the yield of the source driver is improved.

In addition, as shown in FIG. 5, in the source driver of the present embodiment, an inverter 37 functioning as a load carrying capacitance is connected in parallel with the inverter 32 to the output terminal of each NAND gate 31. The output terminal of the inverter 37 is open. As marked with x in FIG. 5, this inverter 37 is cut from the output of the NAND gate just as the input from the defective shift register is cut from the NAND gate 31. By providing such an inverter 37 and optimizing the magnitude of the load of the inverter 37, the delay in the NAND gate 31 to which the outputs from the normally working shift registers without defect is input can be made approximately the same as that in the NAND gate 31 cut from the defective shift register. This is because the load in the former gate increases due to the inverter 37 disposed at the output terminal of the former gate, while the former has driving ability greater than that of the latter.

Meanwhile, an inverter 36 functioning as a load carrying capacitance for compensating the delay is provided also at the output terminal of the NOR gate 33. The output terminal thereof is open similarly to the above-mentioned inverter 37. Similarly to the inverter 37, the inverter 36 is cut from the NOR gate 33 at the time of repairing the defect as marked with x in FIG. 5. For example, the inverters 36 and 37 may be formed of CMOS-TFTs.

Figure 6:
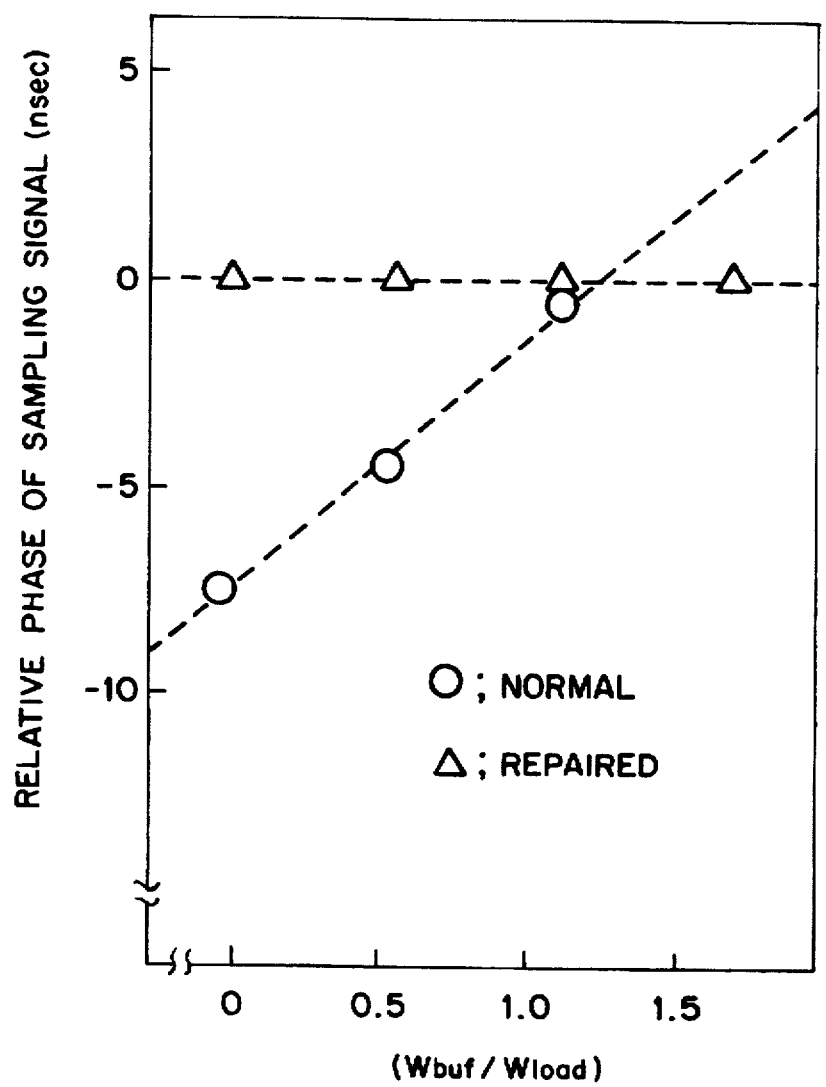
FIG. 6 is a graph showing the relationship between the length of delay and the magnitude of load.

FIG. 6 is a graph showing the relationship between the sampling timing and the load. As shown in FIG. 6, the delay between the clock signal input to the sampling signal generating section and the sampling signal varies almost linearly with respect to the magnitude of the inverter 37 as the load carrying capacitance. Accordingly, by providing a load having substantially the same magnitude as that of the inverter 32, the sampling timing can be adjusted to coincide between the shift register with its defect repaired and the shift register without repair.

In the present embodiment, the case of using two shift registers as the sampling signal generating section having a redundant structure has been described. However, it is possible to provide a plurality of shift registers of more than two.

In succession, the active matrix panel according to still another embodiment of the present invention will be described.

Figure 7A:
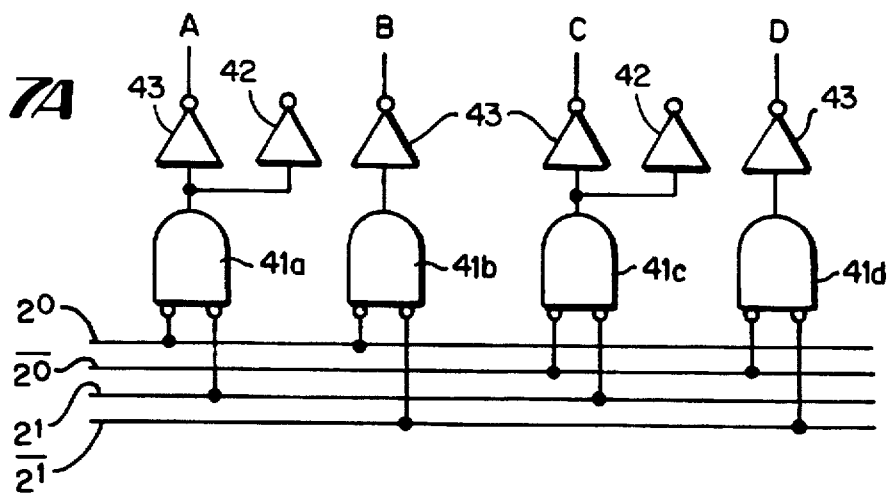
FIG. 7A is a circuit diagram showing a sampling signal generating circuit of another example of an active matrix panel of the present invention.
Figure 7B:
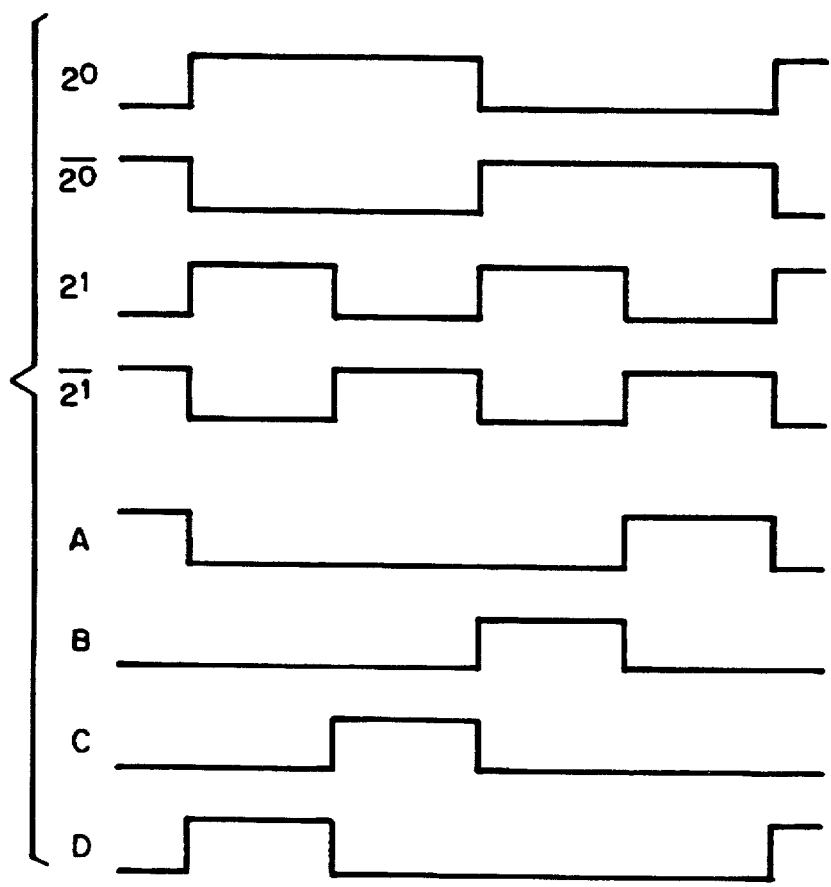
FIG. 7B is a waveform view showing the signal obtained at several points in the sampling signal generating circuit shown in FIG. 7A.

FIG. 7A shows main portions of a sampling signal generating section of the present embodiment. FIG. 7B shows the waveforms of outputs A through D of the sampling signal generating section shown in FIG. 7A. Though the scale of 2 bits or more is necessary for using such a circuit as a driver of an actual display apparatus, for simplicity, the case of 2 bits is described here. FIG. 7B shows one embodiment of the waveform of a selection signal of 2 bits.

As shown in FIG. 7A, two selection signals among from four selection signals are input to each of four NOR gates 41a through 41d. The NOR gates 41a through 41d each has the same configuration. The combination of input selection signals is different in one NOR gate from another.

Figure 8:
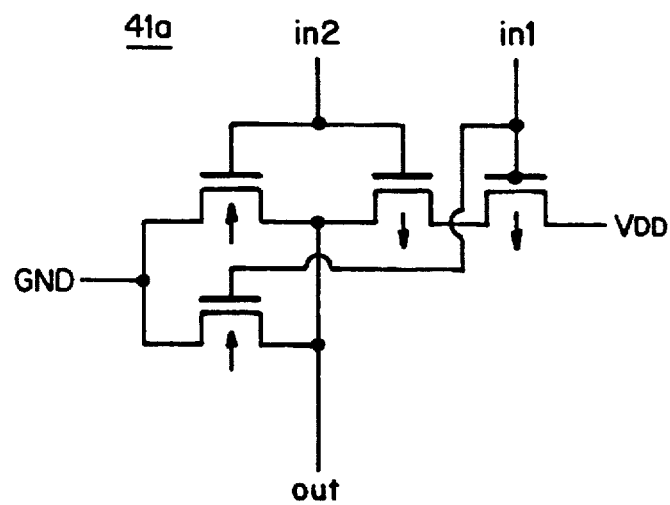
FIG. 8 is a circuit diagram showing a specific configuration of an NOR gate.

The specific configuration of the NOR gate of the present embodiment is shown in FIG. 8. As shown in FIG. 8, the NOR gates 41a through 41d each has two PMOS transistors and two NMOS transistors. In the NOR gate 41a, two selection signals $2^0$ and $2^1$ having the waveforms as shown in FIG. 7B are applied to two input terminals in1 and in2, respectively. Accordingly, when the output from the NOR gate 41a changes from Vdd to GND, i.e., at the fall time of the pulse of the output A of the NOR gate 41a as shown in FIG. 7B, two inputs in1 and in2 both change from GND to Vdd. As a result, two NMOS transistors are both rendered conductive. Similarly, also in the NOR gate 41c to which selection signals $\overline{2^0}$ and $2^1$ are input, two NMOS transistors are both rendered conductive at the fall time of the pulse of the output C. On the other hand, in the NOR gates 41b and 41d, only one of the two NMOS transistors is rendered conductive at the fall time of the pulse of the outputs B and D thereof. As mentioned above, the four NOR gates 41a through 41d have the same configurations, in which the channel width and channel length of each of the transistors are set to be the same. As a result, the driving ability of the NOR gates 41a and 41c becomes different from that of the NOR gates 41b and 41d. In order to adjust the resultant difference in the delay, in the present embodiment, an inverter 42 is provided at each of the output terminals of the NOR gates 41a and 41c with larger driving ability in parallel with the inverter 43 functioning as a buffer. One end of the inverter 42 is open, and the inverter 42 functions as a load carrying capacitance similarly to the inverters 36 and 37 shown in FIG. 5. As a result, the delay in the NOR gates 41a and 41c and that in the NOR gates 41b and 41d can be adjusted to be substantially the same.

For example, a CMOS-TFT can be used as the inverter 42. As the PMOS transistors and the NMOS transistors constituting each of the NOR gates, for example, PMOS-TFTs and NMOS-TFTS may be employed.

In succession, referring to FIGS. 9A and 9B, an active matrix panel according to still another embodiment of the present invention will be described.

Figure 9A:
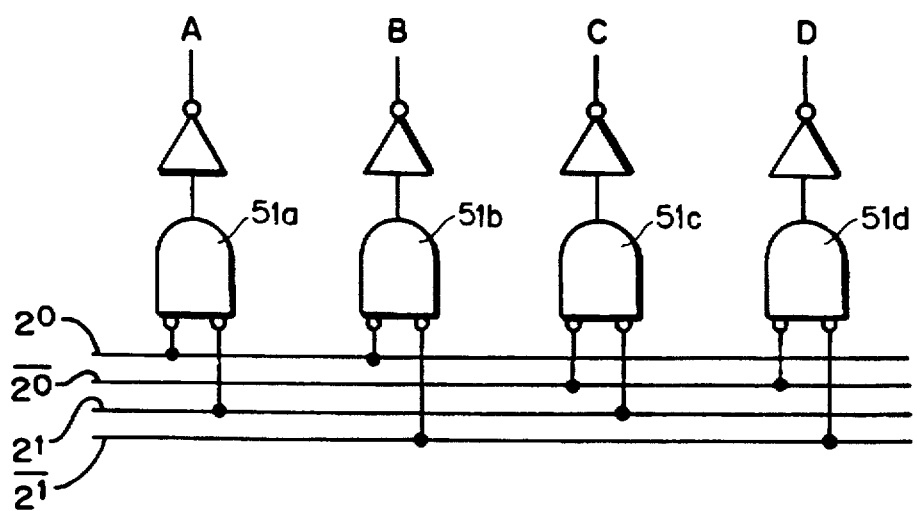
FIG. 9A is a circuit diagram showing a sampling signal generating circuit of still another example of an active matrix panel of the present invention.
Figure 9B:
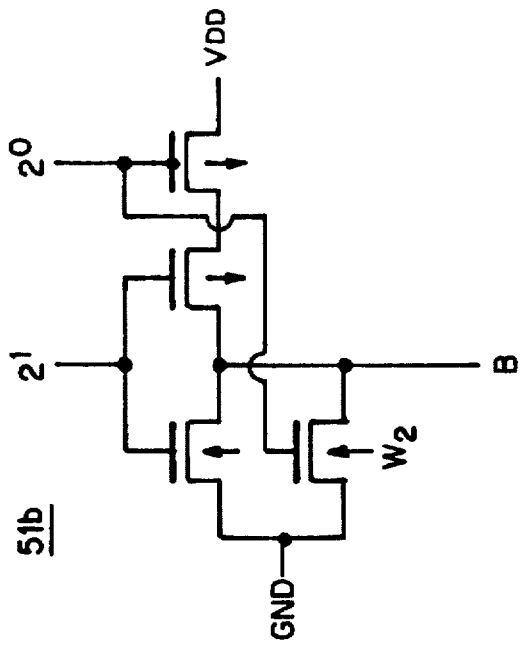
FIGS. 9B and 9C are a circuit diagram showing the specific configuration of the NOR gate shown in FIG. 9A.
Figure 9C:
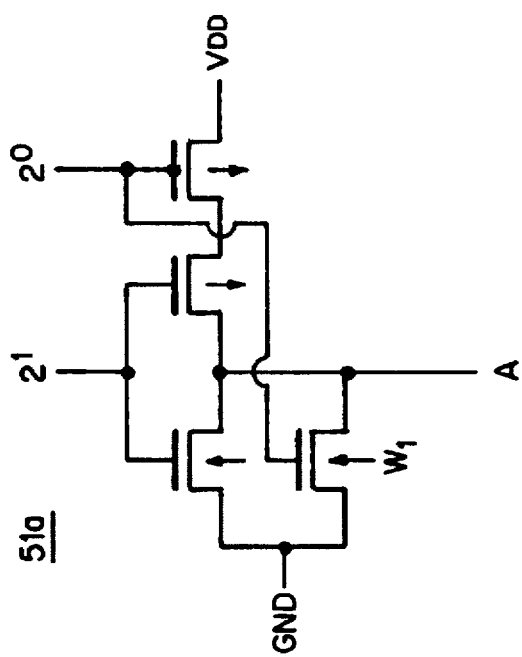

FIG. 9A shows main portions of the sampling signal generating section of the present invention. FIG. 9B shows the configurations of NOR gates 51a and 51c shown in FIG. 9A. In the present embodiment, in place of providing the load carrying capacitance for adjusting the sampling timing, the channel width of the transistor of each of the NOR gates is changed in accordance with the number of transistors which are rendered conductive at the fall time of the sampling signal output from that NOR gate. For example, in the case where a decoder of 2 bits configured as shown in FIG. 9A is used, the number of transistors rendered conductive at the fall time of the sampling signal is two in the NOR gates 51a and 51c, while the number is one in the NOR gates 51b and 51d. Hence, in the present embodiment, the channel width $W_1$ of each of two NMOS transistors of the NOR gates 51a and 51c and the channel width $W_2$ of each of two NMOS transistors of the NOR gates 51b and 51d are set so as to satisfy the relationship of $W_2=2W_1$. Thereby, the driving abilities of the four NOR gates 51a through 51d are adjusted to be the same. As a result, the delay in each of the NOR gates is made substantially the same, which results in improvement of the display quality.

In addition, the same effects can be obtained also by changing not the channel width of the transistor but the channel length thereof.

It is characteristic of the method using a decoder for generating the sampling signal that the direction in which the sampling gates $S_1$ through $S_n$ are scanned can be changed by modifying the waveform of the selection signal to be input to the decoder. However, the change in the scanning direction causes the NOR gates with large delay and the NOR gates with small delay to be reversed with each other. Hence, the sampling timing can not be adjusted by the methods described with reference to FIGS. 7A and 9A. The configuration allowing the adjustment of the sampling timing even in such a case will be described referring to FIG. 10.

Figure 10:
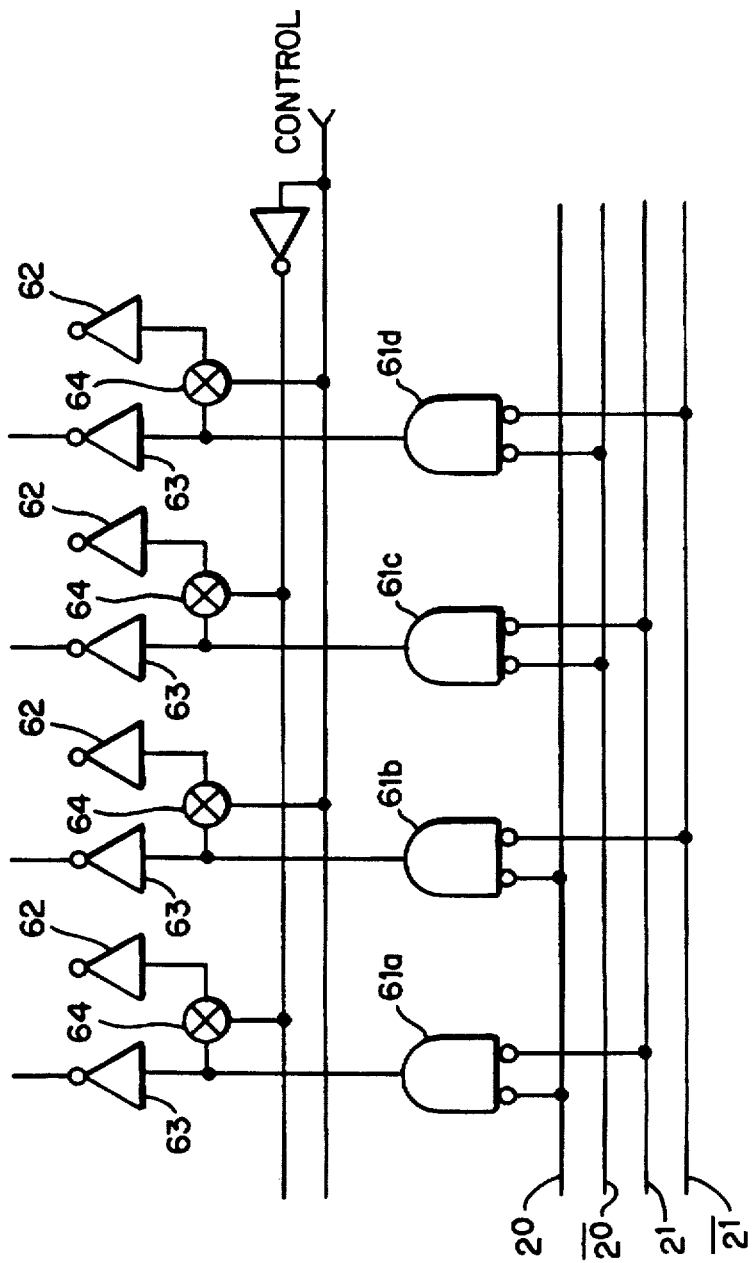
FIG. 10 is a circuit diagram showing a sampling signal generating circuit of still another example of an active matrix panel of the present invention.

FIG. 10 shows main portions of the sampling signal generating section of the present embodiment. For simplicity, the present embodiment is described also on the assumption that a decoder of 2 bits is used. The configuration of the NOR gates 61a through 61d shown in FIG. 10 is the same as that of the NOR gates 41a through 41d shown in FIG. 7A. The configuration of the circuit shown in FIG. 10 is different from that shown in FIG. 7A in that inverters 62, each functioning as a load carrying capacitance, are connected in parallel via switching elements 64 to the output terminal of all the NOR gates 61a through 61d. Each switching element 64 is switched between conductive and non-conductive states by a control signal input to the control terminal of the switching element 64. In the present embodiment, a control signal control is input to the control terminal of the switching element 64 provided at the output terminal of each of the NOR gates 61a and 61c, while the inverted signal of the control signal control is input to the control terminal of each of the NOR gates 61b and 61d. When changing the direction of scanning the sampling gates $S_1$ through $S_n$, by changing the control signal at the same time, it can be switched whether the load carrying capacitance is connected to the NOR gates 61a and 61c or to the NOR gates 61b and 61d. Thus, the sampling timing can be adjusted regardless of the scanning direction.

In the above-mentioned embodiments using a decoder, even if the decoder with a larger scale is employed, the same effects as obtained by such embodiments are assured by extending the above method in accordance with the scale of the decoder. Also, though the case of configuring the decoder by using NOR gates has been described in the above-mentioned embodiments, the same effects as described hereinbefore can be obtained by using the decoder provided with NAND gates as the sampling signal generating section.

Also, in the above-mentioned embodiments, as an element for adjusting the sampling timing, a CMOS-TFT may be employed as an element for adjusting the sampling timing. The capacitance to be used as a load carrying capacitance is not limited to CMOS-TFT. Capacitances of other types realized by a capacitance forming technique in the LSI technology field also can be used as the load carrying capacitance. Furthermore, a source driver can be monolithically formed on the active matrix panel without causing a deviation in the sampling timing, by using a polycrystalline silicon TFT as a CMOS-TFT for the sampling timing adjustment, a PMOS-TFT and a NMOS-TFT for constituting logic elements such as a NOR gate, and other elements.

As described in the foregoing, the active matrix panel according to the present invention uses a plurality of shift registers connected in parallel with each other as a sampling signal generating section having a redundant structure. The load carrying capacitances for adjusting the sampling timing are connected in parallel to the output terminal of the logic gate to which the outputs of corresponding bits of the plurality of shift registers are input. The load carrying capacitances for adjusting the sampling timing are connected in parallel to the output terminal of the logic gate to which the output of the shift registers per predetermined stages is input. When a defect arises in such a redundant structure, the input of the logic gate from the defective shift register is fixed to either 0 or 1, whereby the defect is repaired. In conjunction with the repair, the load carrying capacitance connected to the output terminal of such a logic gate is also cut from the logic gate. Thus, the change in the driving ability of the logic gate, caused by the repair of the defect, can be compensated. Accordingly, the deviation in the sampling timing can be avoided, which, as a result, prevents the display quality from being degraded.

Furthermore, in the case of using a decoder in place of a shift register, a load carrying capacitance for adjusting the sampling timing is connected to the output terminal of the logic gate in accordance with the number of transistors rendered conductive at the fall time of the waveform of the sampling signal output from the logic gate. This allows adjustment of the difference in the delay between the logic gates. The difference in the delay can be adjusted also by changing the channel width or channel length of the transistor in each of the logic gates. This makes it possible to compensate for the fluctuations of the sampling timing found in the respective bits of the decoder, resulting from the different combinations of the selection signals.

Furthermore, in the case where the scanning direction of the sampling gate is different, the logic gate in which adjustment of the delay is required is different. Accordingly, according to the present invention, the connection between the logic gate and the load carrying capacitance is switched in accordance with the sampling gate scanning direction or the like. This makes it possible to compensate the fluctuations in the respective bits of the sampling timing regardless of the scanning direction.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An active matrix panel comprising:
   a liquid crystal section having a plurality of pixels arranged in a matrix;
   a plurality of source lines for applying video signals to the plurality of pixels;
   a source driver for sequentially applying the video signals to the plurality of source lines; and
   a sample hold capacitance for holding the video signals applied to the source line,
   wherein the sample hold capacitance has a pair of electrodes and at least one of the pair of electrodes is in a shape of a comb having a predetermined number of branch parts.

2. An active matrix panel according to claim 1, wherein a capacitance value of the sample hold capacitance is set so that an electric charge corresponding to one of the video signals is held by the branch parts, wherein the number of the branch parts is less than the predetermined number by one.

3. An active matrix panel according to claim 1, wherein each of the predetermined number of branch parts has a tip portion and a root portion, the root portion is connected to that of an adjacent branch part, and a width of the root portion is smaller than that of the tip portion.

4. An active matrix panel comprising:
   a liquid crystal section having a plurality of pixels arranged in a matrix;
   a plurality of source lines for applying video signals to the plurality of pixels;
   a source driver for sequentially applying the video signals to the plurality of source lines; and
   a plurality of sample hold capacitances for holding the video signals applied to the source line,
   wherein each of the source lines is connected to a predetermined number of sample hold capacitances in parallel; and
   wherein the source driver includes:
      a plurality of sampling switching elements for, when being rendered conductive, applying the video signals to the plurality of source lines;
      sampling signal applying means for sequentially applying a plurality of sampling signals to the plurality of sampling switching elements to render the plurality of sampling switching elements conductive; and
      adjustment means for adjusting a timing at which each of the plurality of sampling switching elements is rendered conductive, the adjustment comprising a plurality of load carrying capacitances, each of the plurality of load carrying capacitances being arranged in parallel with an output terminal of a corresponding logic element among the plurality of load carrying capacitances and being cut from the corresponding logic element when one of input terminals of the corresponding logic element is cut.

5. An active matrix panel according to claim 4, wherein the sampling signal applying means includes a plurality of logic elements generating the plurality of sampling signals, respectively.

6. An active matrix panel according to claim 4, wherein the sampling signal applying means includes a plurality of logic elements for selectively receiving a plurality of selection signals and for generating the plurality of sampling signals in accordance with the received selection signals; and wherein driving abilities of the plurality of logic elements are different depending on combination of the received selection signals, and the adjusting means adjusts the driving abilities of the plurality of logic elements to be substantially equal.

7. An active matrix panel according to claim 6, wherein the plurality of logic elements have a plurality of transistors rendered conductive by the received selection signals, and the adjustment means is a plurality of load carrying capacitances, the plurality of load carrying capacitances being connected in parallel with an output terminal of a corresponding logic element in accordance with the number of transistors rendered conductive at a fall time of each of the sampling signals in the corresponding logic element.

8. An active matrix panel according to claim 6, wherein the plurality of logic elements include a plurality of transistors rendered conductive by the received selection signals, and the adjustment means includes a plurality of load carrying capacitances provided at respective output terminals of the plurality of logic elements and a changeover switching element for selectively and electrically connecting the plurality of logic elements to a corresponding load carrying capacitance in accordance with a control signal.

9. An active matrix panel according to claim 1, wherein the source driver includes:
- a plurality of sampling switching elements for, when being rendered conductive, applying the video signals to the plurality of source lines;
- sampling signal applying means for sequentially applying a plurality of sampling signals to the plurality of sampling switching elements to render the plurality of sampling switching elements conductive; and
- adjustment means for adjusting a timing at which each of the plurality of sampling switching elements is rendered conductive.

10. An active matrix panel according to claim 9, wherein the sampling signal applying means includes a plurality of logic elements generating the plurality of sampling signals, respectively, and the adjustment means is a plurality of load carrying capacitances, each of the plurality of load carrying capacitances being arranged in parallel with an output terminal of a corresponding logic element among the plurality of load carrying capacitances and being cut from the corresponding logic element when one of input terminals of the corresponding logic element is cut.

11. An active matrix panel according to claim 9, wherein the sampling signal applying means includes a plurality of logic elements for selectively receiving a plurality of selection signals and for generating the plurality of sampling signals in accordance with the received selection signals; and
wherein driving abilities of the plurality of logic elements are different depending on combination of the received selection signals, and the adjusting means adjusts the driving abilities of the plurality of logic elements to be substantially equal.

12. An active matrix panel according to claim 11, wherein the plurality of logic elements have a plurality of transistors rendered conductive by the received selection signals, and the adjustment means is a plurality of load carrying capacitances, the plurality of load carrying capacitances being connected in parallel with an output terminal of a corresponding logic element in accordance with the number of transistors rendered conductive at a fall time of each of the sampling signals in the corresponding logic element.

13. An active matrix panel according to claim 11, wherein the plurality of logic elements include a plurality of transistors rendered conductive by the received selection signals, and the adjustment means includes a plurality of load carrying capacitances provided at respective output terminals of the plurality of logic elements and a changeover switching element for selectively and electrically connecting the plurality of logic elements to a corresponding load carrying capacitance in accordance with a control signal.

14. An active matrix panel comprising:
- a liquid crystal section having a plurality of pixels arranged in a matrix;
- a plurality of source lines for applying video signals to the plurality of pixels;
- a source driver for sequentially applying the video signals to the plurality of source lines; and
- a plurality of sample hold capacitances for holding the video signals applied to the source line, wherein each of the source lines is connected to a predetermined number of sample hold capacitances in parallel; and wherein the source driver includes:
- a plurality of sampling switching elements for, when being rendered conductive, applying the video signals to the plurality of source lines; and
- sampling signal applying means for sequentially applying a plurality of sampling signals which render the sampling switching elements conductive to the sampling switching elements, wherein the sampling signal applying means includes a plurality of logic elements generating the plurality of sampling signals, respectively, each of the logic elements being provided with a plurality of transistors, and channel widths of the plurality of transistors are set in accordance with the number of transistors rendered conductive at a fall time of a corresponding sampling signal.

15. An active matrix panel according to claim 1, wherein the source driver includes:
- a plurality of sampling switching elements for, when being rendered conductive, applying the video signals to the plurality of source lines; and
- sampling signal applying means for sequentially applying a plurality of sampling signals which render the sampling switching elements conductive to the sampling switching elements, wherein the sampling signal applying means includes a plurality of logic elements generating the plurality of sampling signals, respectively, each of the logic elements being provided with a plurality of transistors, and channel widths of the plurality of transistors are set in accordance with the number of transistors rendered conductive at a fall time of a corresponding sampling signal.

16. An active matrix panel comprising:
- a liquid crystal section having a plurality of pixels arranged in a matrix;
- a plurality of source lines for applying video signals to the plurality of pixels;
- a source driver for sequentially applying the video signals to the plurality of source lines; and
- a plurality of sample hold capacitances for holding the video signals applied to the source line, wherein each of the source lines is connected to a predetermined number of sample hold capacitances in parallel; and wherein the source driver includes:

a plurality of sampling switching elements for, when being rendered conductive, applying the video signals to the plurality of source lines when being rendered conductive; and sampling signal applying means for sequentially applying a plurality of sampling signals which render the sampling switching elements conductive to the sampling switching elements, wherein the sampling signal applying means includes a plurality of logic elements each generating the plurality of sampling signals, respectively, each of the logic elements includes a plurality of transistors, and channel lengths of the transistors are set in accordance with the number of transistors rendered conductive at a fall time of a corresponding sampling signal.

17. An active matrix panel according to claim 1, wherein the source driver includes:

a plurality of sampling switching elements for applying the video signals to the plurality of source lines when being rendered conductive; and sampling signal applying means for sequentially applying a plurality of sampling signals which render the sampling switching elements conductive to the sampling switching elements, wherein the sampling signal applying means includes a plurality of logic elements each generating the plurality of sampling signals, respectively, each of the logic elements includes a plurality of transistors, and channel lengths of the transistors are set in accordance with the number of transistors rendered conductive at a fall time of a corresponding sampling signal.

18. An active matrix panel according to claim 1, further comprising a substrate on which the liquid crystal section and the plurality of source lines are formed, wherein the source driver is formed on the substrate.

19. An active matrix panel comprising:

a liquid crystal section having a plurality of pixels arranged in a matrix;

a plurality of source lines for applying video signals to the plurality of pixels; and a source driver for sequentially applying the video signals to the plurality of source lines, the source driver including:

a plurality of sampling switching elements for, when being rendered conductive, applying the video signal to the plurality of source lines; and sampling signal applying means for sequentially applying a plurality of sampling signals which render the sampling switching elements conductive to the sampling switching elements, wherein the sampling signal applying means includes a plurality of logic elements for generating a plurality of sampling signals and adjustment means for adjusting a deviation of timing at which the sampling switching elements are rendered conductive, the deviation resulting from a difference in driving ability among the plurality of logic elements.

20. An active matrix panel according to claim 19, wherein the adjustment means is a plurality of load carrying capacitances, each of which is arranged in parallel with an output terminal of a corresponding logic element among the plurality of logic elements and is cut from the corresponding logic element when one of input terminal of the corresponding logic element is cut.

21. An active matrix panel according to claim 19, wherein the plurality of logic elements selectively receive a plurality of selection signals and generate the plurality of sampling signals in accordance with the received selection signals, driving abilities of the logic elements are different depending on combination of the received selection signals, and the adjustment means adjusts the driving abilities of the logic elements to be substantially equal.

22. An active matrix panel according to claim 21, wherein the plurality of logic elements include a plurality of transistors rendered conductive by the received selection signals, and the adjustment means is a plurality of load carrying capacitances, the load carrying capacitances in the corresponding logic element being connected in parallel with an output terminal of the corresponding logic element in accordance with the number of transistors rendered conductive at a fall time of each of the sampling signals.

23. An active matrix panel according to claim 21, wherein the logic elements have a plurality of transistors rendered conductive by the received selection signals, and the adjustment means has a plurality of load carrying capacitances provided at respective output terminals of the plurality of logic elements and a changeover switching element for selectively and electrically connecting the logic elements to a corresponding load carrying capacitance in accordance with a control signal.

24. An active matrix panel according to claim 19, wherein each of the plurality of logic elements has a plurality of transistors, and channel widths of the transistors are set in accordance with the number of transistors rendered conductive at a fall time of a corresponding sampling signal.

25. An active matrix panel according to claim 24, wherein each of the plurality of logic elements has a plurality of transistors, and channel lengths of the transistors are set in accordance with the number of transistors rendered conductive at a fall time of a corresponding sampling signal.

26. An active matrix panel according to claim 19, further comprising a substrate on which the liquid crystal section and the plurality of source lines are formed, wherein the source driver is formed on the substrate.

27. An active matrix panel according to claim 1, wherein the source driver includes:

a plurality of sampling switching elements for, when being rendered conductive, applying the video signals to the plurality of source lines;

a sampling signal applying circuit for sequentially applying a plurality of sampling signals to the plurality of sampling switching elements to render the plurality of sampling switching elements conductive; and an adjustment unit for adjusting a timing at which each of the plurality of sampling switching elements is rendered conductive.

28. An active matrix panel according to claim 1, wherein the source driver includes:

a plurality of sampling switching elements for applying the video signals to the plurality of source lines when being rendered conductive; and a sampling signal applying circuit for sequentially applying a plurality of sampling signals which render the sampling switching elements conductive to the sampling switching elements, wherein the sampling signal applying circuit includes a plurality of logic elements each generating the plurality of sampling signals, respectively, each of the logic elements includes a plurality of transistors, and channel lengths of the transistors are set in accordance with the number of transistors rendered conductive at a fall time of a corresponding sampling signal.

* * * * *